United States Patent
Shin et al.

(10) Patent No.: US 8,338,004 B2
(45) Date of Patent: Dec. 25, 2012

(54) MAGNETIC TUNNEL JUNCTION STRUCTURE HAVING FREE LAYER WITH OBLIQUE MAGNETIZATION

(75) Inventors: Kyung Ho Shin, Seoul (KR); Byoung Chul Min, Gyeonggi-Do (KR)

(73) Assignee: Korea Institute of Science and Technology (KR)

( * ) Notice: Subject to any disclaimer, the term of this patent is extended or adjusted under 35 U.S.C. 154(b) by 507 days.

(21) Appl. No.: 12/608,103

(22) Filed: Oct. 29, 2009

(65) Prior Publication Data

US 2010/0109111 A1     May 6, 2010

(30) Foreign Application Priority Data

Oct. 30, 2008 (KR) .................. 10-2008-0106942

(51) Int. Cl.
*G11B 5/39* (2006.01)
*H01F 10/32* (2006.01)
*G11C 11/02* (2006.01)

(52) U.S. Cl. ............ 428/811.1; 428/811.5; 360/324.11; 360/324.12; 360/324.2; 365/158; 365/209

(58) Field of Classification Search .................. None
See application file for complete search history.

(56) References Cited

U.S. PATENT DOCUMENTS

| | | | |
|---|---|---|---|
| 6,205,052 B1 | 3/2001 | Slaughter et al. | |
| 6,532,164 B2 * | 3/2003 | Redon et al. | 365/97 |
| 6,980,469 B2 * | 12/2005 | Kent et al. | 365/171 |
| 7,170,778 B2 * | 1/2007 | Kent et al. | 365/171 |
| 7,307,876 B2 * | 12/2007 | Kent et al. | 365/171 |
| 7,573,737 B2 * | 8/2009 | Kent et al. | 365/173 |
| 7,911,832 B2 * | 3/2011 | Kent et al. | 365/171 |
| 8,054,677 B2 * | 11/2011 | Zhu | 365/158 |
| 8,085,582 B2 * | 12/2011 | Nakamura et al. | 365/158 |
| 2005/0174704 A1 * | 8/2005 | Lin et al. | 360/324.12 |
| 2005/0185455 A1 | 8/2005 | Huai | |
| 2009/0237987 A1 * | 9/2009 | Zhu et al. | 365/171 |
| 2011/0241141 A1 * | 10/2011 | Nagai et al. | 257/421 |

FOREIGN PATENT DOCUMENTS

| | | |
|---|---|---|
| FR | 2817998 | 6/2002 |
| JP | 2002-261352 | 9/2002 |
| JP | 2008-07-2008 | 3/2008 |
| KR | 10-2007-0121504 | 12/2007 |

OTHER PUBLICATIONS

Search Report issued by European Patent Office in connection with corresponding application No. EP 09 25 2502 on Jan. 25, 2010.

(Continued)

*Primary Examiner* — Kevin Bernatz
(74) *Attorney, Agent, or Firm* — Ostrolenk Faber LLP (57) ABSTRACT

The present invention provides a magnetic tunnel junction structure, including a first magnetic layer having a fixed magnetization direction and a second magnetic layer having a reversible magnetization direction. A non-magnetic layer is formed between the first magnetic layer and the second magnetic layer and a third magnetic layer allows the magnetization direction of the second magnetic layer to be inclined with respect to a plane of the second magnetic layer by a magnetic coupling to the second magnetic layer with a vertical magnetic anisotropic energy thereof larger than a horizontal magnetic anisotropic energy thereof. A crystal-structure separation layer is formed between the second magnetic layer and the third magnetic layer for separating a crystal orientation between the second and the third magnetic layers.

10 Claims, 6 Drawing Sheets

OTHER PUBLICATIONS

A High Magnetic Field Sensor Based on Magnetic Tunnel Junctions, M. Hehn, et. al., *European Physical Journal Applied Physics* 28, 79-81 (2004); XP-002563248.

Office Action issued by the Korean Patent Office on Jan. 26, 2011 in connection with corresponding Korean Patent Application No. 10-2008-0106942.

Office Action issued by the Korean Patent Office on Jul. 28, 2010 in connection with corresponding Korean Patent Application No. 10-2008-0106942.

Office Action issued by the Japanese Patent Office on May 8, 2012 in connection with corresponding Japanese Patent Application No. 2009-251256.

* cited by examiner

MAGNETIC TUNNEL JUNCTION STRUCTURE HAVING FREE LAYER WITH OBLIQUE MAGNETIZATION

CROSS-REFERENCE TO RELATED APPLICATIONS

Pursuant to 35 U.S.C. §119(a), this application claims the benefit of earlier filing date and right of priority to Korean Application No. 10-2008-0106942 filed on Oct. 30, 2008, the contents of which are incorporated by reference herein in its entirety.

BACKGROUND OF THE INVENTION

1. Field of the invention

The present invention relates to a magnetic tunnel junction structure having a free layer with oblique magnetization in which a large read signal is provided and a critical current value required for switching is reduced. The present invention can be applied for a magneto-resistive RAM (MRAM) or radio-frequency oscillator.

2. Description of the related art

Magnetic random access memories (MRAMs) currently developed for practical applications utilizes a magnetic tunnel junction (MTJ) element that forms a ferromagnetic tunnel junction as a magneto-resistive device. The MTJ device includes tri-layer consisting of two magnetic layers separated by a non-magnetic layer, and current flows by tunneling through the non-magnetic layer (tunnel barrier).

In case of a conventional MRAM, the magnetization of a ferromagnetic material constituting a unit cell is typically controlled by magnetic field. By contrast, it is possible to realize a current-induced switching of magneto-resistive device in which the magnetization of a ferromagnetic material can be changed by applying a spin-polarized current. The current-induced magneto-resistive device is referred to as a device in which the magnetization direction can be controlled by applying a current to the magnetic layer thereof, differently from a typical magneto-resistive device in which the magnetization direction of a magnetic layer is controlled by applying a magnetic field.

The method of reading information in a current-induced magneto-resistive device is similar to the case of a conventional MTJ or giant magneto-resistance (GMR) device. The device has a low resistance value if the magnetization orientation of a free magnetic layer and that of a fixed magnetic layer are in is parallel configuration, and a high resistance value if they are in anti-parallel configuration, which correspond to digital information "0" and "1", respectively.

The major difference between a current-induced magneto-resistive device and a conventional MTJ or GMR device lies in the method of recording information. In case where the magnetization direction of a fixed magnetic layer has an angle with that of a free magnetic layer and electrons are flowing from the fixed magnetic layer to the free magnetic layer, electrons polarized by the fixed magnetic layer are injected into the free magnetic layer. In this case, the transverse component of spin angular momentum of electrons is transferred into the free magnetic layer, and if an amount of the angular momentum exceeds a threshold level, then the magnetization direction of the free magnetic layer is reversed in the direction parallel to that of the fixed magnetic layer. In contrast, in case where electrons are flowing from the free magnetic layer to the fixed magnetic layer, electrons having a spin of the same direction to that of the fixed magnetic layer are injected into and passed through the fixed magnetic layer, and some of electrons having a spin of the opposite direction to the fixed magnetic layer are reflected at the interface of the non-magnetic layer and fixed magnetic layer and returned to the free magnetic layer. Those electrons exerts a torque transverse to the spin direction of the free magnetic layer and reverses the magnetization direction of the free magnetic layer, thereby allowing the direction of the two magnetic layers to be anti-parallel.

In addition, the current-induced magneto-resistive device may be also applicable to a spin torque oscillator for microwave applications by using the same principle.

Such a current-induced magneto-resistive device has a typical problem in that an amount of current required for reversing the magnetization direction is large. In general, one transistor is connected to each device to constitute a memory by using a current-induced magneto-resistive device. The amount of current is limited by the size of a transistor, and thus the size of a transistor should become larger to allow more current to flow therethrough. If the current is large, then it is difficult to fabricate a drive circuit for controlling a device.

Such a problem may cause an increase of the power consumption in driving a device and also gives rise to difficulties in the integration of a device.

As a consequence, it is required to reduce the amount of current necessary to reverse the magnetization direction in a current-induced magneto-resistive device.

SUMMARY OF THE INVENTION

The present invention is contrived to solve the aforementioned problem according to the related art, and an object of the invention is, 1) to provide a magnetic tunnel junction structure in which a large read signal is provided and a critical current value required for switching is reduced.

2) to provide a magnetic tunnel junction structure by which a high spin polarization and a high magneto-resistance ratio can be obtained, and 3) to provide a magnetic tunnel junction structure in which material stability is enhanced in the post-processes such as annealing process or the like, and the memory operation thereof.

In order to accomplish the foregoing object, the present invention provides magnetic tunnel junction structure, including a first magnetic layer having a fixed magnetization direction; a second magnetic layer having a reversible magnetization direction; a non-magnetic layer formed between the first magnetic layer and the second magnetic layer; a third magnetic layer allowing the magnetization direction of the second magnetic layer to be inclined with respect to a plane of the second magnetic layer by a magnetic coupling to the second magnetic layer, and having a perpendicular magnetic anisotropic energy thereof larger than an in-plane magnetic anisotropic energy thereof; and a crystal-structure separation layer formed between the second magnetic layer and the third magnetic layer for separating a crystallographic structure of the second magnetic layer from that of the third magnetic layer.

Furthermore, the present invention may further include a buffer layer, which is formed under the third magnetic layer for increasing perpendicular magnetic anisotropic energy of the third magnetic layer.

According to the present invention, first, it is possible to remarkably reduce a critical current value required for magnetic reversal by forming a third magnetic layer having high perpendicular magnetic anisotropic energy to be magnetically coupled to a second magnetic layer adjacent to a non-magnetic layer (i.e., tunnel barrier layer) constituting a magnetic tunnel junction structure, and thus inclining the magnetization direction of the second magnetic layer with respect to a horizontal direction thereof (i.e., a plane of the second magnetic layer) by a magnetic coupling between the second and the third magnetic layers.

Second, it is possible to obtain a high spin polarization and a high magneto-resistance ratio by allowing a free magnetic layer and a fixed magnetic layer adjacent to a non-magnetic layer constituting a magnetic tunnel junction structure to have an in-plane magnetic anisotropy (including a case having an inclination angle within ±30°.

Third, it is possible to enhance thermal stability, production yield, and memory reliability by using a material, the device characteristics of which are not deteriorated during annealing process with a magnetic layer having high perpendicular magnetic anisotropic energy.

Fourth, it is possible to induce a large magneto-resistance ratio as well as an inclination angle of the magnetization direction, without destroying the crystal structure of a second magnetic layer showing the most excellent characteristics when having a body centered cubic (BCC), even if a perpendicular magnetic anisotropic material having a face centered cubic (FCC) or hexagonal close-packed (HCP) structure is introduced as a third magnetic layer-constituting material, by introducing a crystal-structure separation layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, an embodiment of the present invention will be described in detail with reference to the accompanying drawings.

As illustrated in FIGS. 1 through 6, a magnetic tunnel junction structure according to each embodiment of the present invention includes a first magnetic layer 10, a non-magnetic layer 20, a second magnetic layer 30, a third magnetic layer 40, and a crystal-structure separation layer 50.

Here, the second magnetic layer 30, the crystal-structure separation layer 50, and the third magnetic layer 40 may be commonly designated as a free magnetic layer or free magnetization layer.

Figure 4:
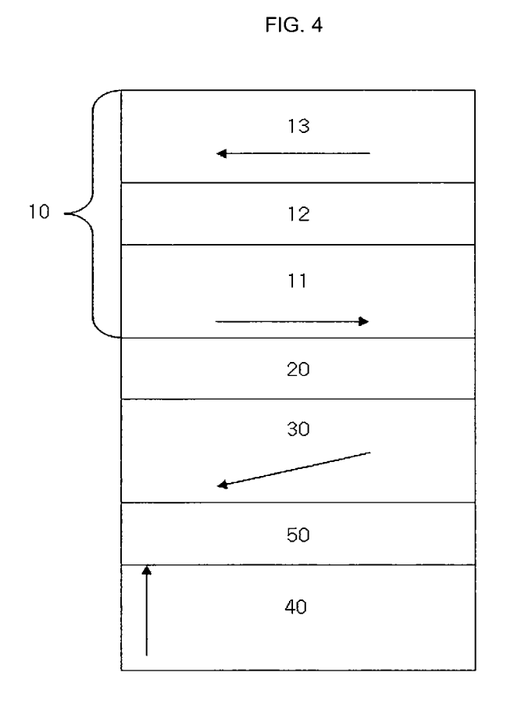
Figure 5:
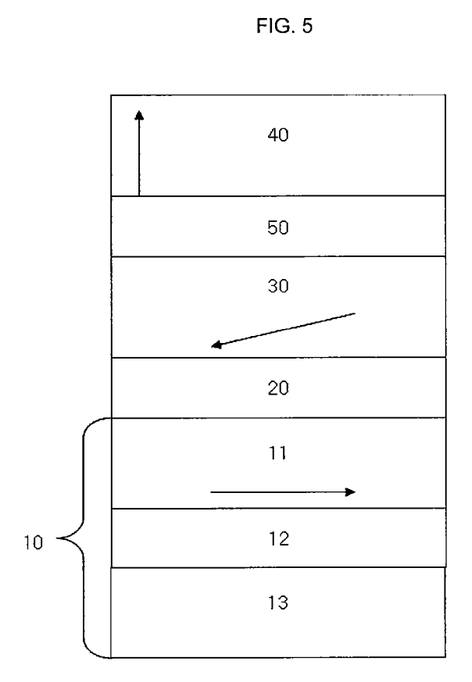
Figure 6:
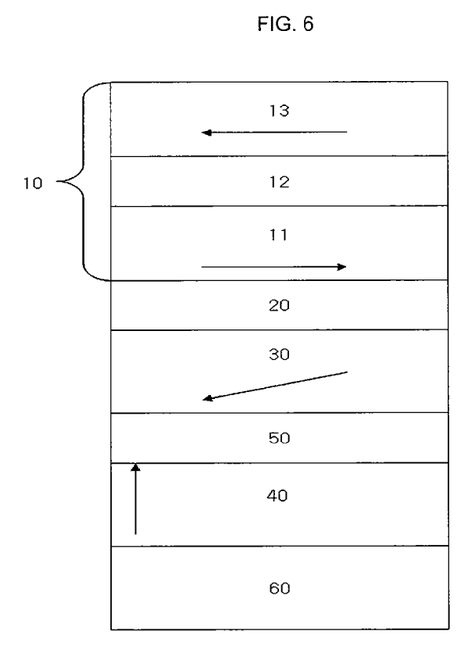

The first magnetic layer 10 has an in-plane magnetic anisotropy as a fixed magnetization layer in which the magnetization direction is fixed, and it is separated from the second magnetic layer 30 by the non-magnetic layer 20. The magnetization direction of the first magnetic layer 10 is substantially parallel to a plane of the first magnetic layer (i.e. a horizontal direction or a thin-film plane of the first magnetic layer) due to a shape magnetic anisotropy (i.e., in-plane magnetic anisotropy) of the thin-film. The first magnetic layer 10 may includes CoFeX (here, "X" is at least any one selected from the group consisting of B, Re, Rh, Cr, Cu, Gd, and Tb). Also, as illustrated in FIGS. 4 through 6, the first magnetic layer 10 may be a synthetic ferri-magnetic tri-layer having a tri-layer structure of a magnetic layer 11, a non-magnetic layer 12, and a magnetic layer 13. For example, it may have a lamination structure of CoFeB (a layer adjacent to the non-magnetic layer), Ru, and CoFe, or the like. In this manner, in case of using a tri-layer structure, it is possible to obtain the effect of improving thermal stability, improving critical current density, and the like, compared to a case of using a single layer.

The non-magnetic layer 20 is formed between the first and the second magnetic layers 10, 30 to serve as a tunnel barrier. The non-magnetic layer 20 may include an insulator or semiconductor, and MgO, $Al_2O_3$, $HfO_2$, $TiO_2$, $Y_2O_3$, and $Yb_2O_3$ may be used for the insulation substance. In case of using MgO as the non-magnetic layer 20, it is possible to obtain a high magneto-resistance ratio by coherent tunneling. The thickness of the non-magnetic layer 20 is preferably 0.7-2 nm. If it is thinner than 0.7 nm, then the TMR ratio can be decreased because the effect of spin filtering is reduced and a leakage current is likely due to pin holes. If it is thicker than 2 nm, then it may cause a problem of increasing the drive voltage too much because the resistance-area (RA) product is increased.

The second magnetic layer 30, as a free magnetization layer in which the magnetization direction can be reversed, has an oblique magnetization. If the third is magnetic layer 40 is not formed, the magnetization of the second magnetic layer 30 may be substantially parallel to a plane of the second magnetic layer due to a shape magnetic anisotropy (i.e., in-plane magnetic anisotropy) of the thin-film. However, in the present invention, the magnetization direction of the second magnetic layer 30 is inclined with respect to a horizontal direction thereof (i.e., a plane of the second magnetic layer or thin-film plane), because a magnetic coupling is made between the second magnetic layer 30 and the third magnetic layers 40 having a large perpendicular magnetic anisotropy by interposing the crystal-structure separation layer 50 therebetween. The inclination angle is preferably $-30° \leq \theta < 0°$ or $0° < \theta \leq 30°$. The second magnetic layer 30 may includes CoFeX (here, "X" is at least any one selected from the group consisting of B, Re, Rh, Cr, Cu, Gd, and Tb). The thickness of the second magnetic layer 30 is preferably 1-5 nm. A enough spin polarization cannot be obtained if the thickness of the magnetic layer is too thin, and the magnetization switching by a current becomes difficult if the thickness is too thick.

The third magnetic layer 40 is formed to be adjacent to the crystal-structure separation layer 50, and the magnetization direction of the second magnetic layer 30 is inclined with respect to a plane of the second magnetic layer 30 by a magnetic coupling to the second magnetic layer 30. The third magnetic layer 40 has a characteristic such that perpendicular magnetic anisotropic energy (i.e., magnetic anisotropic energy in the direction perpendicular to a plane of the third magnetic layer, $K_u$, the uni-axial anisotropy energy) is larger than the shape magnetic anisotropic energy of the thin film (i.e., in-plane magnetic anisotropic energy, $2\pi M_s^2$, where $M_s$ is saturation magnetization of the film). Moreover, as illustrated in FIGS. 1 through 6, the perpendicular magnetic anisotropic energy of the third magnetic layer 40 is too large and thus the magnetization easy axis is preferably oriented in a direction perpendicular to the horizontal direction (i.e., a plane of the second magnetic layer or a plane of the third magnetic layer).

Figure 1:
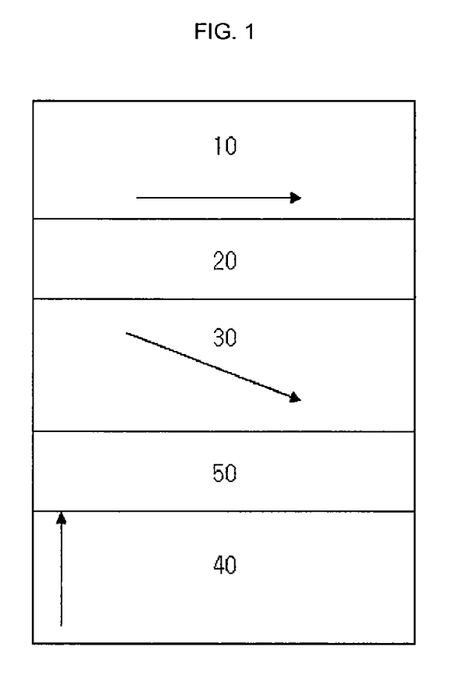
FIGS. 1 through 6 are schematic cross-sectional views illustrating a magnetic tunnel junction structure according to each embodiment of the present invention.
Figure 2:
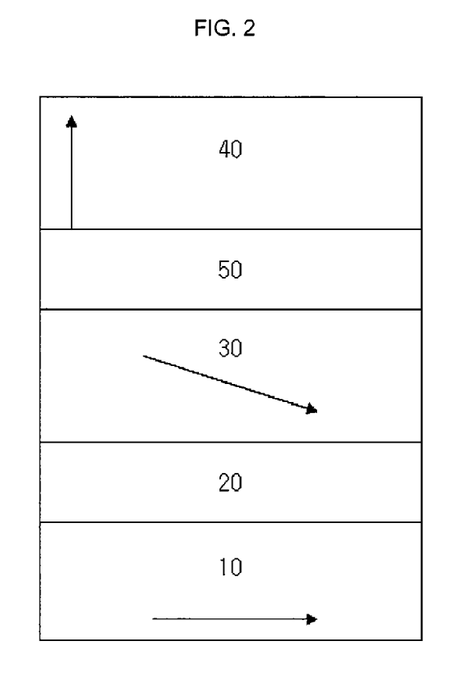
Figure 3:
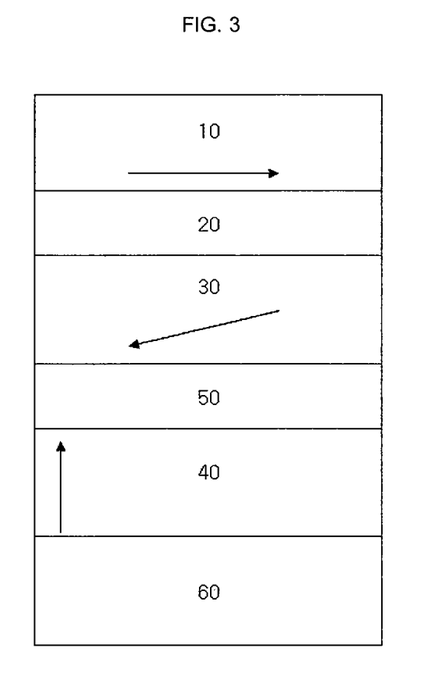

According to circumstances, in order to facilitate the magnetization to a direction perpendicular to the third magnetic layer 40, as illustrated in FIGS. 3 and 6, a buffer layer 60 may be formed under the third magnetic layer 40. The buffer layer 60 may include at least any one selected from the group consisting of Au, Cu, Pd, Pt, Ta, and diamond-like carbon.

In order to allow the third magnetic layer 40 to have a perpendicular magnetic anisotropy, it may be possible to use a rare-earth transition metal alloy such as GdFeCo, TbFeCo, or the like, or to use a [Co/Pt]$_n$, [Co/Pd]$_n$, [Ni/Pt]$_n$ or [CoCr/Pt]$_n$-based multi-layer thin film (here, "n" is between 1 and 10) for the third magnetic layer 40.

The third magnetic layer, more preferably, includes [Co/Ni]$_n$ or [CoX alloy/Ni]$_n$-based multi-layer thin film, because this multi-layer thin film has an advantage that electrical resistance is small and production cost is low, and furthermore a material stability is excellent in the post-processes such as annealing process or the like, and the memory operation thereof compared to a rare-earth-based thin film, and production yield and memory reliability can be enhanced. Here, "n" is between 1 and 10, and "X" is at least any one selected from the group consisting of B, Re, Rh, Cr, Cu, Gd, and Tb.

Furthermore, perpendicular magnetic anisotropy energy indicating a strength of perpendicular magnetic anisotropy can be adjusted based on the repetition number of the Co/Ni or CoX alloy/Ni bi-layer. Accordingly, it may be possible to control an inclination angle (or deviation angle) in the direction of magnetization within the second magnetic layer 30. For example, in case where the third magnetic layer 40 is made of a multi-layer thin film of [Co/Ni]$_n$, the thickness of Co is preferably 0.2-0.4 nm, and the thickness of Ni is preferably 0.4-1.4 nm, and for that purpose, the repetition number can be selected between 1 and 10. When the thickness of Co and Ni is out of those values, it may be difficult to obtain a desired perpendicular magnetic anisotropy. The thickness of Co and Ni is preferably decreased to obtain a high perpendicular magnetic anisotropy, and a thick Co and Ni layer is preferably selected to obtain a low perpendicular magnetic anisotropy.

Furthermore, in case of [Co/Ni]$_n$-based multilayer, it may be possible to control a magnetic coupling between the second and the third magnetic layer 30, 40 based on whether a layer adjacent to the second magnetic layer 30 is Ni or Co. In the present invention, both two lamination methods can be used. It is also applicable in case of [CoX alloy/Ni]$_n$-based multilayer.

Figure 7:
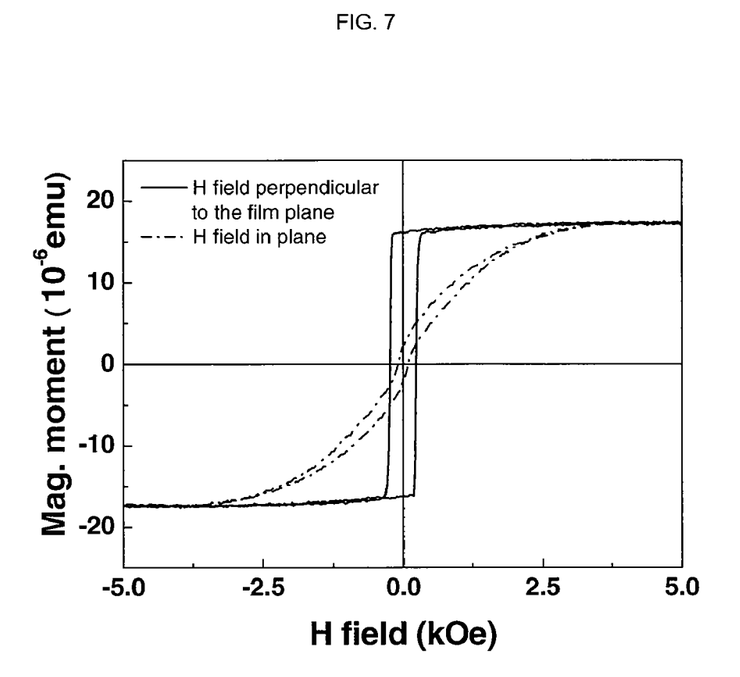
FIG. 7 is a M-H hysteresis loop in case where the third magnetic layer consists of a [Co/Ni]$_n$-based multi-layer thin film.

An example of implementing a perpendicular magnetic anisotropy using a [Co/Ni]$_n$-based thin film is illustrated in FIG. 7. In FIG. 7, the blue line is a magnetization-magnetic field curve in which it is measured by applying a magnetic field in a direction perpendicular to the thin-film plane. The remanent magnetization (a value of magnetization M when external magnetic field H=0) is substantially same as the saturation magnetization value, and thus it is shown that the direction perpendicular to a thin-film plane is a magnetic easy axis. On the other hand, the red line shows a magnetization (M) versus magnetic field (H) curve in which the magnetic field applied in a direction horizontal to the thin-film plane. The remanent magnetization value is close to "0", and thus it is shown that this direction is a magnetic hard axis. This experiment clearly shows that the is fabricated [Co/Ni]$_n$-based thin film has a perpendicular magnetic anisotropy.

On the other hand, the crystal-structure separation layer 50 is formed between the second magnetic layer 30 and the third magnetic layer 40 to induce a magnetic coupling between the second and the third magnetic layers 30, 40, and separate a crystallographic structure between the second and the third magnetic layers 30, 40.

The principle of inducing a magnetic coupling by the crystal-structure separation layer 50 may be described as follows. Free electrons within the crystal-structure separation layer 50 exist like a sinusoidal wave that is confined in a quantum well, and those free electrons mediate an exchange interaction between both magnetic layers 30, 40, thereby inducing a magnetic coupling by interposing the crystal-structure separation layer 50 therebetween.

The reason why the separation of crystallographic structure between the second and the third magnetic layers 30, 40 is important is as follows.

For example, the magnetic tunnel junction using MgO as a tunnel barrier shows a high magneto-resistance ratio, because the crystallographic orientation of MgO (002) matches with the crystallographic orientation of the first and the second magnetic layers adjacent to that layer and thus only the wave function having a specific symmetry ($\Delta_1$ symmetry) selectively penetrates the MgO barrier. Consequently, it is required for the magnetic layer to have a specific crystallographic orientation in order to obtain a high magneto-resistance ratio. The crystal structure of a magnetic material suitable for coherent tunneling in combination with the MgO thin film is a body centered cubic (BCC) structure. Typically, a method of obtaining a magnetic layer having a BCC crystal structure can be generally divided into two types. First, there is a method of epitaxially growing a magnetic layer having a BCC crystal structure using a method such as molecular beam epitaxy, or the like. Second, there is a method of forming a magnetic layer having an amorphous structure such as CoFeB at both ends of the MgO barrier, allowing the CoFeB layer to lose a boron (B) content thereof by annealing and to be transformed from an amorphous structure to a crystal structure, thereby forming a BCC structure that is epitaxial with a crystal structure of MgO.

On the other hand, a specific crystal structure is also required to have a high perpendicular magnetic anisotropy. Most perpendicular magnetic anisotropic materials using a [Co/Pt]$_n$, [Co/Pd]$_n$, [Ni/Pt]$_n$ or [CoCr/Pt]$_n$-based multi-layer thin film is formed with a face centered cubic (FCC) or hexagonal close-packed (HCP) structure. In case where a perpendicular magnetic anisotropic material adjoins a magnetic layer, a FCC or HCP crystal texture propagates into the magnetic layer during annealing, thereby destroying a BCC crystal structure originally possessed by the magnetic layer.

Figure 8:
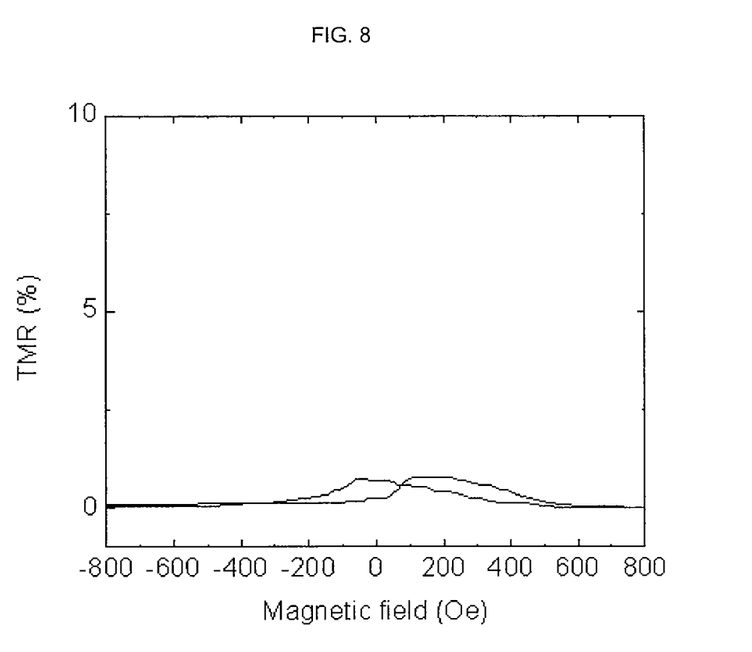
FIG. 8 is a magneto-resistance curve in case where the crystal-structure separation layer is not introduced.

In case where the crystal-structure separation layer 50 is not introduced but the third magnetic layer 40 having a large perpendicular magnetic anisotropy is directly adjacent to the second magnetic layer 30, the magneto-resistance ratio with applying an externally applied magnetic field is illustrated in FIG. 8. The body centered cubic (BCC) structure is destroyed while a crystal texture of the third magnetic layer 40 propagates into a crystal structure of the second magnetic layer 30 during annealing process, and as a result, it is shown that magneto-resistance ratio becomes very small, less than 1%. Consequently, in case where the crystallographic structure of a perpendicular magnetic anisotropic material propagates into the second magnetic layer, it is clearly shown that the characteristics of an MgO-based magnetic tunnel junction can be remarkably deteriorated.

Figure 9:
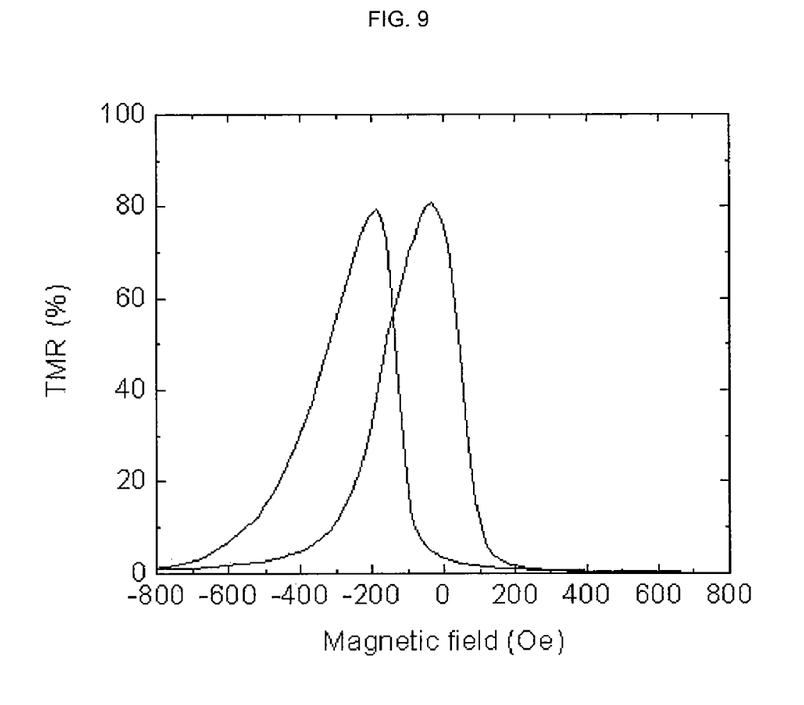
FIG. 9 is a magneto-resistance curve of the magnetic tunnel junction structure of FIG. 6 (in case where the crystal-structure separation layer is introduced).

The measurement result of a magneto-resistance ratio in case of introducing the crystal-structure separation layer 50 (an embodiment of FIG. 6) is illustrated in FIG. 9. It is shown that the magnetic tunnel junction shows an excellent magneto-resistance ratio equal to or greater than 80%, differently from the previous result for which the crystal-structure separation layer is not introduced. From this result, it is shown that the introduction of the crystal-structure separation layer 50 is required in order to obtain a high magneto-resistance ratio when a perpendicular magnetic anisotropic material is used.

The crystal-structure separation layer 50 has preferably an amorphous structure. Specifically, it is preferably a material having a high melting point, and not being crystallized but maintaining an amorphous structure during a post-thermal treatment process (for example, at temperatures of 200-600° C.) for fabricating the thin film. For example, for the crystal-structure separation layer 50 constituting material, it may be possible to select at least any one selected from the group consisting of Ru, Ta, Re, and Rh.

In the magnetic tunnel junction structure obtained in this manner, the magnetization direction (i.e., magnetic moment direction) of the second magnetic layer 30 in a stable state—in which a current is not applied—forms an inclination within ±30° with respect to the horizontal direction by a magnetic coupling between the second and the third magnetic layers 30, 40, thereby facilitating the rotation of a magnetic moment in the direction perpendicular to a magnetization plane during the process of magnetization switching by applying a current. As a result, it is possible to remarkably reduce a critical current value required for switching.

Figure 10:
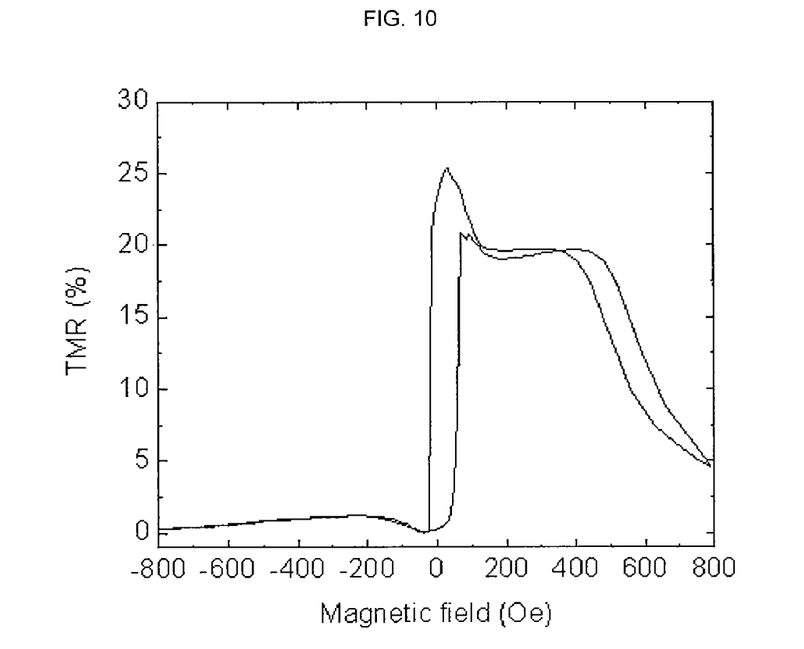
FIG. 10 is a magneto-resistance curve in case where a third magnetic layer having a strong perpendicular magnetic anisotropy is used in the magnetic tunnel junction structure of FIG. 5.
Figure 11:
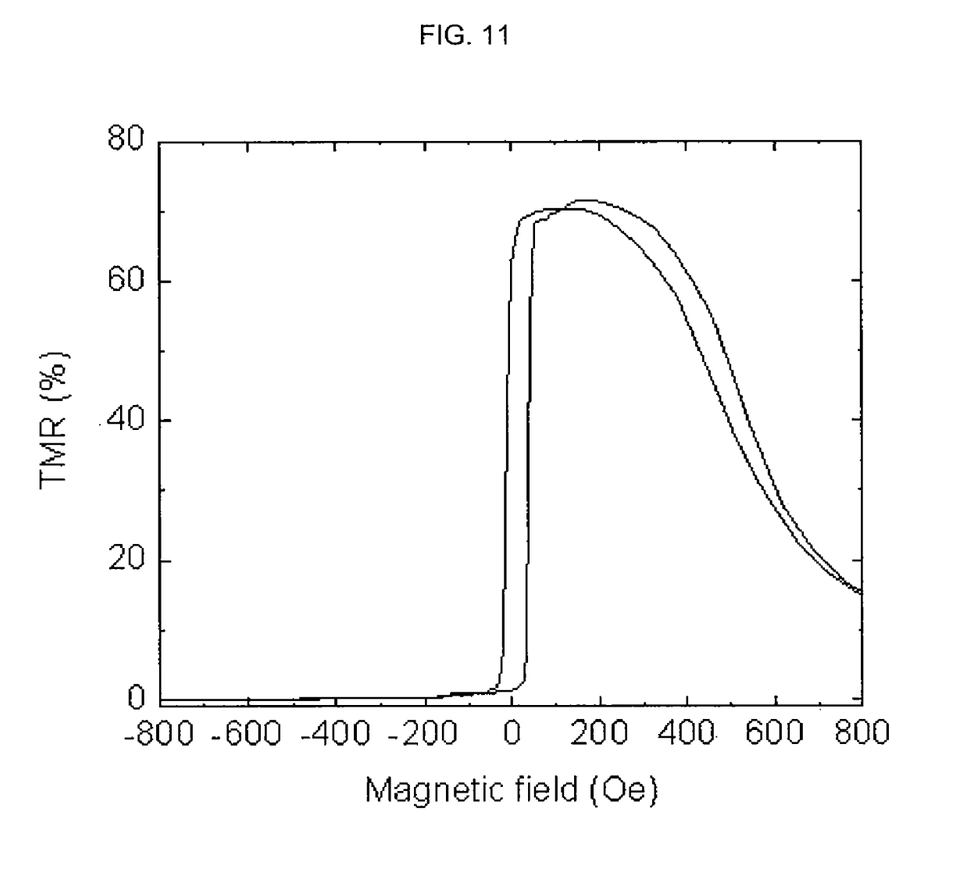
FIG. 11 is a magneto-resistance curve in case where a third magnetic layer having a weak perpendicular magnetic anisotropy is used in the magnetic tunnel junction structure of FIG. 5.

On the other hand, for a modified embodiment of the present invention, the magneto-resistance ratio in case where the third magnetic layer 40 is fabricated on top the crystal-structure separation layer 50 and the second magnetic layer 30 as depicted in FIG. 5, is illustrated in FIGS. 10 and 11. Referring to FIG. 10, in case of using a material having a strong perpendicular magnetic anisotropy as the third magnetic layer 40, the magnetization direction of the second magnetic layer 30 is greatly influenced by a perpendicular magnetic anisotropy, and thus it is shown that the magneto-resistance curve is deformed. In addition, Referring to FIG. 11, in case of using a material having a relatively weak perpendicular magnetic anisotropy as the third magnetic layer 40, the magnetization direction of the second magnetic layer 30 is slightly influenced by a perpendicular magnetic anisotropy, and thus it is shown that the magneto-resistance curve reveals a typical characteristic.

Although the present invention has been described with reference to the examples as illustrated in the drawings, these are merely illustrative, and it should be understood by those skilled in the art that various modifications and equivalent other embodiments of the present invention can be made.

What is claimed is:

1. A magnetic tunnel junction structure, comprising:
   a first magnetic layer having a fixed magnetization direction;
   a second magnetic layer having a body centered cubic (BCC) lattice structure and having a reversible magnetization direction;
   a non-magnetic layer formed between the first magnetic layer and the second magnetic layer;
   a third magnetic layer having a face centered cubic (FCC) or hexagonal close-packed (HCP) lattice structure and having a perpendicular magnetic anisotropic energy thereof larger than an in-plane magnetic anisotropic energy thereof; and
   a crystal-structure separation layer formed between the second magnetic layer and the third magnetic layer for separating a crystallographic structure between the second and the third magnetic layers and having an amorphous structure;
   wherein a magnetization direction of the second magnetic layer is inclined with respect to a plane of the second magnetic layer with an angle ($\theta$) of the magnetization direction of $-30° \leq \theta < 0°$ or $0° < \theta \leq 30°$,
   wherein a magnetization easy axis of the third magnetic layer is oriented in a direction perpendicular to a plane of the third magnetic layer, and
   wherein a magnetic coupling is made between the second magnetic layer and the third magnetic layers.

2. The magnetic tunnel junction structure of claim 1, wherein the first magnetic layer has a lamination structure of magnetic layer/non-magnetic layer/magnetic layer.

3. The magnetic tunnel junction structure of claim 1, wherein the first and the second magnetic layers comprises CoFeX, respectively (here, "X" is at least any one selected from the group consisting of B, Re, Rh, Cr, Cu, Gd, and Tb).

4. The magnetic tunnel junction structure of claim 1, wherein the non-magnetic layer comprises an insulator or semiconductor, and the insulator is at least any one selected from the group consisting of $MgO, Al_2O_3, HfO_2, TiO_2, Y_2O_3,$ and $Yb_2O_3$.

5. The magnetic tunnel junction structure of claim 1, wherein the third magnetic layer comprises GdFeCo or TbFeCo, or comprises a $[Co/Pt]_n$, $[Co/Pd]_n$, $[Ni/Pt]_n$ or $[CoCr/Pt]_n$-based multi-layer thin film (here, "n" is between 1 and 10).

6. The magnetic tunnel junction structure of claim 1, wherein the third magnetic layer comprises $[Co/Ni]_n$ or $[CoX$ alloy/$Ni]_n$-based multi-layer thin film, and here "n" is between 1 and 10, and "X" is at least any one selected from the group consisting of B, Re, Rh, Cr, Cu, Gd, and Tb.

7. The magnetic tunnel junction structure of claim 1, wherein the crystal-structure separation layer comprises a material having an amorphous structure when performing annealing at temperatures of 200-600° C.

8. The magnetic tunnel junction structure of claim 1, wherein the crystal-structure separation layer comprises at least any one selected from the group consisting of Ru, Ta, Re, and Rh.

9. The magnetic tunnel junction structure of claim 1, further comprising: a buffer layer formed under the third magnetic layer for increasing perpendicular magnetic anisotropic energy of the third magnetic layer.

10. The magnetic tunnel junction structure of claim 9, wherein the buffer layer comprises at least any one selected from the group consisting of Au, Cu, Pd, Pt, Ta, and diamond-like carbon.

* * * * *